(12) United States Patent
Wang et al.

(10) Patent No.: US 11,539,307 B2
(45) Date of Patent: Dec. 27, 2022

(54) MICRO POWER GENERATION DEVICE AND ELECTRONIC APPARATUS WITH THE SAME

(71) Applicant: BOE TECHNOLOGY GROUP CO., LTD., Beijing (CN)

(72) Inventors: Zhidong Wang, Beijing (CN); Quanguo Zhou, Beijing (CN); Lijia Zhou, Beijing (CN); Ronghua Lan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 335 days.

(21) Appl. No.: 16/770,208

(22) PCT Filed: Jan. 14, 2020

(86) PCT No.: PCT/CN2020/072024
§ 371 (c)(1),
(2) Date: Jun. 5, 2020

(87) PCT Pub. No.: WO2020/147721
PCT Pub. Date: Jul. 23, 2020

(65) Prior Publication Data
US 2021/0211071 A1 Jul. 8, 2021

(30) Foreign Application Priority Data
Jan. 18, 2019 (CN) .......................... 201910049625.X (51) Int. Cl.
*H02N 1/04* (2006.01)
*B81B 1/00* (2006.01)
*B81B 7/00* (2006.01)

(52) U.S. Cl.
CPC .............. *H02N 1/04* (2013.01); *B81B 1/004* (2013.01); *B81B 7/007* (2013.01); *B81B 2201/03* (2013.01)

(58) Field of Classification Search
None
See application file for complete search history.

(56) References Cited

U.S. PATENT DOCUMENTS

| 9,825,558 B2 | 11/2017 | Zhang et al. |
| 2004/0113526 A1 | 6/2004 | Kirjavainen |

(Continued)

FOREIGN PATENT DOCUMENTS

| CN | 103944443 A | 7/2014 |
| CN | 203722511 U | 7/2014 |

(Continued)

OTHER PUBLICATIONS

International Search Report and Written Opinion dated Apr. 12, 2020 for PCT Patent Application No. PCT/CN2020/072024.

(Continued)

*Primary Examiner* — Alexander G Ghyka
(74) *Attorney, Agent, or Firm* — Perilla Knox & Hildebrandt LLP; Kenneth A. Knox (57) ABSTRACT

The present disclosure proposes a micro power generation device including a plurality of generators stacked one above the other. Each of the plurality of generators includes: an upper electrode and a lower electrode spaced up and down; a spacer provided between peripheral edges of the upper electrode and the lower electrode; an upper friction material layer provided on a side of the upper electrode facing the lower electrode; and a lower friction material layer provided on a side of the lower electrode facing the upper electrode. The upper friction material layer, the lower friction material layer and the spacer together form a cavity. An intermediate spacer is provided between each adjacent two generators, each adjacent two generators and the intermediate spacer together form an intermediate cavity, and the intermediate cavity is filled with gas. A cavity of an upper one of any two adjacent generators communicates with the intermediate cavity between the two adjacent generators.

20 Claims, 6 Drawing Sheets

(56) References Cited

U.S. PATENT DOCUMENTS

2015/0318800 A1    11/2015  Zhang et al.
2018/0145244 A1    5/2018  Otagiri et al.

FOREIGN PATENT DOCUMENTS

| | | | | |
|---|---|---|---|---|
| CN | 104426418 A | 3/2015 | | |
| CN | 104868777 A | 8/2015 | | |
| CN | 104426418 B | 5/2017 | | |
| CN | 106787930 | * 5/2017 | ............... | H02N 1/04 |
| CN | 107437902 A | 12/2017 | | |
| CN | 207475430 U | 6/2018 | | |
| CN | 109171061 A | 1/2019 | | |
| CN | 109713933 A | 5/2019 | | |
| JP | 2018087801 A | 6/2018 | | |
| WO | 2015027710 A1 | 3/2015 | | |

OTHER PUBLICATIONS

1st Office Action dated Aug. 23, 2019 for Chinese Patent Application No. 201910049625.X.
2nd Office Action dated Feb. 21, 2020 for Chinese Patent Application No. 201910049625.X.
3rd Office Action dated Jun. 22, 2020 for Chinese Patent Application No. 201910049625.X.

\* cited by examiner

MICRO POWER GENERATION DEVICE AND ELECTRONIC APPARATUS WITH THE SAME

CROSS-REFERENCE TO RELATED APPLICATIONS

The present application a national phase application under 35 U.S.C. § 371 of International Patent Application No. PCT/CN2020/072024 filed on Jan. 14, 2020, which is based on and claims priority to Chinese Patent Application No. 201910049625.X, filed on Jan. 18, 2019, where the contents of both of which are hereby incorporated by reference in their entireties herein.

TECHNICAL FIELD

The present disclosure relates to the field of nano power generation technologies and, in particular, to a micro power generation device and an electronic apparatus with the same.

BACKGROUND

Nano power generation technology (for example, a power generation device represented by a triboelectric nanogenerator) as a micro-power generation technology has become more and more widely used in various fields. The triboelectric nanogenerators have great application prospects in wearable or Internet-of-Things (IOT) fields due to its self-driven characteristics, requiring no external power supply and so on.

SUMMARY

The present disclosure aims to overcome at least one of shortcomings of the above-mentioned prior art, and to provide a micro power generation device capable of simultaneously supplying power to multiple power consumption devices.

The present disclosure further aims to overcome at least one of the shortcomings of the above-mentioned prior art, and to provide an electronic apparatus with the above-mentioned micro power generation device.

To achieve the above objects, the present disclosure adopts the following technical solutions.

An aspect of the present disclosure provides a micro power generation device, including: a plurality of generators stacked one above the other. Each of the generators includes: an upper electrode and a lower electrode spaced up and down; a peripheral spacer provided between peripheral edges of the upper electrode and the lower electrode; an upper friction material layer provided on a side of the upper electrode facing the lower electrode; and a lower friction material layer provided on a side of the lower electrode facing the upper electrode. The upper friction material layer, the lower friction material layer, and the peripheral spacer together form an internal cavity, and an intermediate spacer is provided between any adjacent two generators. Any adjacent two generators and the intermediate spacer together form an intermediate cavity, the intermediate cavity is filled with gas. The internal cavity of an upper one of any two adjacent generators communicates with the intermediate cavity between the two generators.

According to an embodiment of the present disclosure, the upper one of any two adjacent generators is provided with a through hole, and the through hole is configured to communicate the cavity of the upper generator with the intermediate cavity between the two generators.

According to an embodiment of the present disclosure, an orifice at one end of the through hole is opened on a surface of the lower friction material layer facing the upper friction material layer, and an orifice at the other end of the through hole is opened on a surface of the lower electrode facing the upper electrode an adjacent generator below the generator.

According to an embodiment of the present disclosure, the upper one of any two adjacent generators is provided with a plurality of through holes.

According to an embodiment of the present disclosure, the plurality of through holes is arranged in an array; and/or the plurality of through holes is evenly arranged.

According to an embodiment of the present disclosure, an orifice at one end of the through hole is opened on a side wall of the cavity formed by the spacer, and an orifice at the other end of the through hole is opened on a side wall of the intermediate cavity formed by the intermediate spacer.

According to an embodiment of the present disclosure, the through hole of at least one of the generators includes at least one first through hole and at least one second through hole; an orifice at one end of the first through hole is opened on a surface of the lower friction material layer facing the upper friction material layer, and an orifice at the other end of the first through hole is opened on a surface of the lower electrode facing the upper electrode of an adjacent generator below the generator; and an orifice at one end of the second through hole is opened on a side wall of the cavity formed by the spacer, and an orifice at the other end of the second through hole is opened on a side wall of the intermediate cavity formed by the intermediate spacer.

According to an embodiment of the present disclosure, the through hole is a round hole, a square hole, or a polygonal hole.

According to an embodiment of the present disclosure, a material of the upper electrode is indium tin oxide; and/or a material of the lower electrode is indium tin oxide.

According to an embodiment of the present disclosure, a material of the upper friction material layer is polydimethylsiloxane, and a material of the lower friction material layer is nylon; or the material of the upper friction material layer is nylon, and the material of the lower friction material layer is polydimethylsiloxane.

According to an embodiment of the present disclosure, a surface of the upper friction material layer of each generator facing the lower friction material layer has a micro-nano structure; and/or a surface of the lower friction material layer of each generator facing the upper friction material layer has a micro-nano structure.

According to an embodiment of the present disclosure, the gas is an inert gas.

According to an embodiment of the present disclosure, the micro power generation device includes two generators stacked one above the other.

According to another aspect of the present disclosure, there is provided an electronic apparatus including a power generation device and multiple power consumption devices. The power generation device is the micro power generation device proposed by the present disclosure and described in the above embodiments, and the multiple power consumption devices are electrically connected to multiple generators of the micro power generation device, respectively, and the multiple generators are configured to supply power to the multiple power consumption devices, respectively.

According to an embodiment of the present disclosure, the electronic apparatus further includes a plurality of power supply loops, and the plurality of power supply loops are electrically connected between the multiple generators and the multiple power consumption devices, respectively.

BRIEF DESCRIPTION OF THE DRAWINGS

By considering the following detailed description of embodiments of the present disclosure in conjunction with the drawings, various objects, features, and advantages of the present disclosure will become more apparent. In addition, the drawings are merely schematic representations of the present disclosure and are not necessarily drawn to scale. In the drawings, the same reference numerals always denote the same or similar parts.

DETAILED DESCRIPTION

Exemplary embodiments embodying the features and advantages of the present disclosure will be described in detail in the following description. It should be understood that the present disclosure can have various changes in different embodiments, all of which do not deviate from the scope of the present disclosure, and the descriptions and drawings therein are essentially for illustrative purposes, rather than to limit the present disclosure.

In the following description of different exemplary embodiments of the present disclosure, reference is made to the accompanying drawings which form a part of the present disclosure and in which, by way of example, different exemplary structures and systems and steps that can implement various aspects of the present disclosure are shown. It should be understood that other specific solutions of components, structures, exemplary devices, systems, and steps may be used, and structural and functional modifications may be made without departing from the scope of the present disclosure. Moreover, although the terms "above", "between", "within", etc. may be used in this specification to describe different exemplary features and elements of the present disclosure, these terms are used herein for convenience only, for example, according to the directions of the examples described in the drawings. Nothing in this specification should be understood as requiring a specific three-dimensional orientation of the structure to fall within the scope of the present disclosure.

The existing triboelectric nanogenerators usually adopt a single-layer structure. When the same area of the triboelectric nanogenerator is pressed, only a single current can be output, and only a single power consumption device can be powered. In view of this, a micro power generation device is proposed in the present disclosure.

The reference numerals are described as follows: first generator 110; upper electrode 111; lower electrode 112; upper friction material layer 113; lower friction material layer 114; second generator 120; upper electrode 121; lower electrode 122; upper friction material layer 123; lower friction material layer 124; first peripheral spacer 131; second peripheral spacer 132; intermediate spacer 133; first internal cavity 141; second internal cavity 142; intermediate cavity 143; first through hole 151; second through hole 152; gas 160; first loop 171; second loop 172; first power consumption device 210; and second power consumption device 220.

Figure 1:
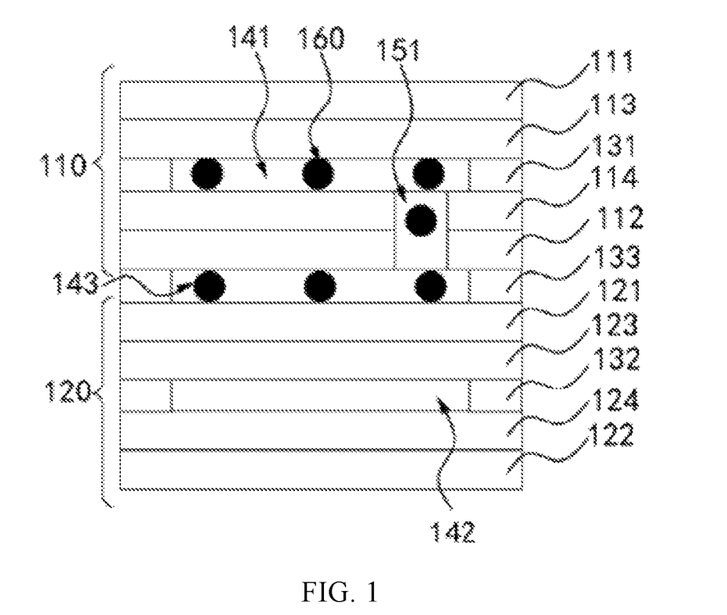
FIG. 1 is a schematic diagram of a micro power generation device according to an exemplary embodiment.

Referring to FIG. 1, which representatively shows a schematic diagram of a micro power generation device proposed by the present disclosure. In this exemplary embodiment, the micro power generation device proposed by the present disclosure is explained by taking the application of triboelectric nano-generation technology as an example. It is readily understood by those skilled in the art that, in order to apply the related design of the present disclosure to other types of power generation processes, various modifications, additions, substitutions, deletions, or other changes may be made to the specific embodiments described below. These variations are still within the scope of the principle of the micro-generator device proposed in the present disclosure.

As shown in FIG. 1, in this embodiment, the micro power generation device proposed in the present disclosure mainly includes a first generator 110 and a second generator 120. With reference to FIGS. 2 to 7, FIG. 2 representatively shows a schematic arrangement of a plurality of through holes of a micro power generation device capable of embodying the principles of the present disclosure; FIGS. 3 to 7 representatively show schematic diagrams illustrating an operation state of the micro power generation device capable of embodying the principles of the present disclosure. The structure, connection manner, and functional relationship of each main component of the micro power generation device proposed by the present disclosure will be described in detail below in conjunction with the above drawings.

As shown in FIG. 1, in this embodiment, the first generator 110 mainly includes an upper electrode 111 and a lower electrode 112. Specifically, a first peripheral spacer 131 is provided between the upper electrode 111 and the lower electrode 112, and the upper electrode 111 and the lower electrode 112 are spaced apart by the first peripheral spacer 131. A side of the upper electrode 111 facing the lower electrode 112 is provided with an upper friction material layer 113, and correspondingly, a side of the lower electrode 112 facing the upper electrode 111 is provided with a lower friction material layer 114. The upper friction material layer 113, the lower friction material layer 114, and the first peripheral spacer 131 together define a first internal cavity 141, and the first internal cavity 141 is filled with gas 160.

As shown in FIG. 1, in this embodiment, the second generator 120 mainly includes an upper electrode 121 and a lower electrode 122. Specifically, a second peripheral spacer 132 is provided between the upper electrode 121 and the lower electrode 122, and the upper electrode 121 and the lower electrode 122 are spaced apart by the second peripheral spacer 132. A side of the upper electrode 121 facing the lower electrode 122 is provided with an upper friction material layer 123, and correspondingly, a side of the lower electrode 122 facing the upper electrode 121 is provided with a lower friction material layer 124. The upper friction material layer 123, the lower friction material layer 124, and the second peripheral spacer 132 together define a second internal cavity 142 which is a sealed cavity.

As shown in FIG. 1, in this embodiment, the upper electrode 121 is provided on a side of the lower electrode 112 away from the upper electrode 111. An intermediate spacer 133 is provided between the lower electrode 112 and the upper electrode 121, and the lower electrode 112 and the upper electrode 121 are spaced apart by the intermediate spacer 133. The lower electrode 112, the upper electrode 121, and the intermediate spacer 133 together define an intermediate cavity 143. The first generator 110 is provided with a through hole, which communicates the first internal cavity 141 and the intermediate cavity 143. That is, the intermediate cavity 143 is also filled with the gas 160. The whole cavity formed after the first internal cavity 141 communicates with the intermediate cavity 143 is a sealed cavity. That is, the gas 160 filled in the sealed cavity does not escape outside the first internal cavity 141 or the intermediate cavity 143 during a compression deformation of the upper electrode 111 and the upper friction material layer 113. Through the above design, the functional realization of the micro power generation device can be ensured.

It should be noted that, in this embodiment, the first internal cavity 141 and the intermediate cavity 143 are both filled with the gas 160. When the upper electrode 111 of the first generator 110 is deformed by a pressure, the gas 160 in the first internal cavity 141 is partly compressed into the intermediate cavity 143 through the through hole, so that the upper electrode 121 of the second generator 120 is deformed under pressure. That is, in the above process, the gas 160 serves as a medium for transferring a mechanical deformation from the upper electrode 111 of the first generator 110 to the upper electrode 121 of the second generator 120. Therefore, in order to realize the above-mentioned function, it is not limited whether the second internal cavity 142 of the second generator 120 is filled with gas. In addition, since the above-mentioned generators can be processed and manufactured in a vacuum environment, if the second internal cavity 142 is selected not to be filled with the gas, a vacuum cavity design can be adopted.

Figure 3:
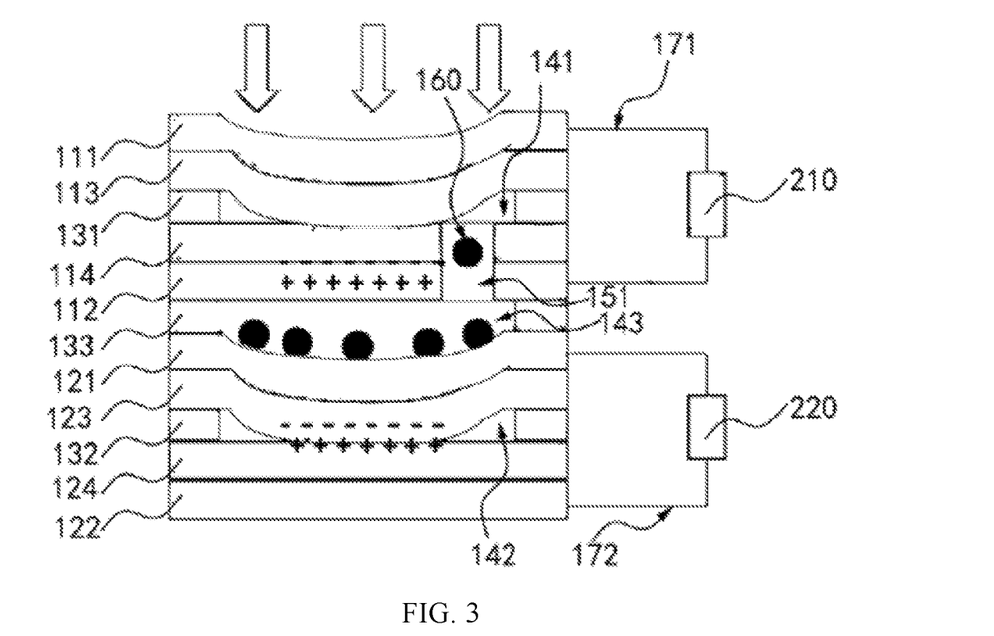
FIG. 3 is a schematic diagram of the micro power generation device shown in FIG. 1 in an operating state.

As shown in FIG. 3, in this embodiment, the first generator 110 may supply power to the first power consumption device 210 through a power supply loop, such as the first loop 171. The first loop 171 is electrically connected to the upper electrode 111, the lower the electrode 112 and the first power consumption device 210. At the same time, the second generator 120 may supply power to the second power consumption device 220 through another power supply loop, such as the second loop 172. The second loop 172 is electrically connected to the upper electrode 121, the lower electrode 122, and the second power consumption device 220.

It should be noted that in this embodiment, the first generator 110 and the second generator 120 adopt substantially the same design. That is, both generators have the upper electrode and the lower electrode. The upper electrode and the lower electrode of each generator are spaced apart by the peripheral spacer and are provided opposite to each other, so as to form an internal cavity. The surface of the upper electrode and the surface of the lower electrode of each generator, which are provided opposite to each other, are provided with the upper friction material layer and the lower friction material layer, respectively.

As described above, the micro power generation device proposed in the present disclosure may include a plurality of generators stacked one above the other. Among the generators, the generator located at the lowest is the second generator as described in this embodiment, and the remaining generators are all first generators stacked above the second generator. Every two adjacent generators are spaced apart up and down through the intermediate spacer 133 to define the intermediate cavity 143. The through hole is provided in the lower electrode and the lower friction material layer of the upper one of any two adjacent generators, and the through hole communicates with the internal cavity of any generator and the intermediate cavity of the adjacent generator below the generator (thus, the second generator located at the lowest does not have this through hole). Each intermediate cavity and the internal cavity of the upper one of any two adjacent generators are filled with the gas 160 (there is no need to fill the gas 160 in the internal cavity of the second generator located at the lowest). That is to say, in this embodiment, the micro power generation device including only two generators (that is, one first generator 110 and one second generator 120) is taken as example for illustration. In other embodiments, the micro power generation device may further include more than two generators. At this time, the second generator 120 is the lowest one among the plurality of generators, and the remaining multiple generators above the second generator 120 are first generators 110.

Through the above design, the micro power generation device proposed by the present disclosure may supply power to a plurality of power consumption devices. Specifically, while the uppermost generator is subjected to pressure and friction to generate charges, the gas in the generator's internal cavity is compressed into the intermediate cavity below the generator, so that another generator below the generator is subjected to pressure and friction to generate charges, and so on to achieve the operation of multiple generators stacked one above the other. That is, through the above structural design of the present disclosure, after each internal cavity is filled with gas, only one press is needed to realize the chain reaction of the multiple generators. It realizes the function that the multiple generators simultaneously supply power. The micro power generation device proposed by the present disclosure can use multiple generators to supply power simultaneously, thereby realizing power supply from the power generation device to multiple power consumption devices.

It should be noted that the operating principle of each generator of the micro power generation device proposed in the present disclosure can be roughly referred to the operating principle of related triboelectric nanogenerator. Specifically, the triboelectric nanogenerator generally includes an upper electrode and a lower electrode provided oppositely, and an upper friction material layer and a lower friction material layer respectively provided on opposite surfaces of the upper electrode and the lower electrode. On this basis, when the triboelectric nanogenerator is in an initial state, the upper friction material layer and the lower friction material layer are not in contact, and there is no charges distribution on the upper and lower parts of the triboelectric nanogenerator (the upper part refers to the upper electrode and the upper friction material layer, the lower part refers to the lower electrode and the lower friction material layer). When the surfaces of the upper and lower parts are in contact, friction occurs between the upper friction material layer and the lower friction material layer. Because the two friction material layers are made from different materials, that is, the two have different abilities to bind electrons, the two friction material layers have positive and negative charges of equal amounts, respectively. When the upper and lower parts are separated, an electric field is generated between the two surfaces by the opposite friction charges, forming a potential difference. In order to shield the potential difference, electrons are driven to flow from the upper electrode to the lower electrode through the external circuit. When the upper electrode returns to the initial position, the current in the external circuit will disappear and the potential difference will be balanced. When the upper part approaches the surface of the lower part again, electrons will flow from the lower electrode to the upper electrode through the external circuit to neutralize the positive charges, thus forming an opposite current pulse in the external circuit. When the upper part and the lower part are completely in contact again, the current in the external circuit will disappear. Based on the above principle, the periodic external force is continuously applied to press and release the device, and the device will generate a periodic current. If the generated electrical energy is stored in the capacitor, it can supply power to electronic devices with certain power, and it can also be used directly to drive electronic devices and equipment.

For the principle that the two friction material layers carry positive and negative charges of the same amounts respectively, reference can be made to the related principle of triboelectrification. That is, the fact that the electrons transfer from one object to another object made the two objects carry the same quantity of charges. The object that gets electrons carries negative charges, and the object that loses electrons carries positive charges. Therefore, when a triboelectric effect takes place on two objects without charges, the quantity of charges they carry must be equal.

In addition, as shown in FIG. 1, in this embodiment, the through hole may adopt the structural design shown in the drawing. In addition, in order to distinguish it from the through holes of other structural forms, the through hole may be defined as the first through hole 151. Specifically, the first through hole 151 may penetrate the lower friction material layer 114 and the lower electrode 112. An orifice at one end of the first through hole 151 is opened on the surface of the lower friction material layer 114 facing the upper friction material layer 113, and an orifice at the other end of the first through hole 151 is opened on the surface of the lower electrode 112 facing the upper electrode 121.

Figure 2:
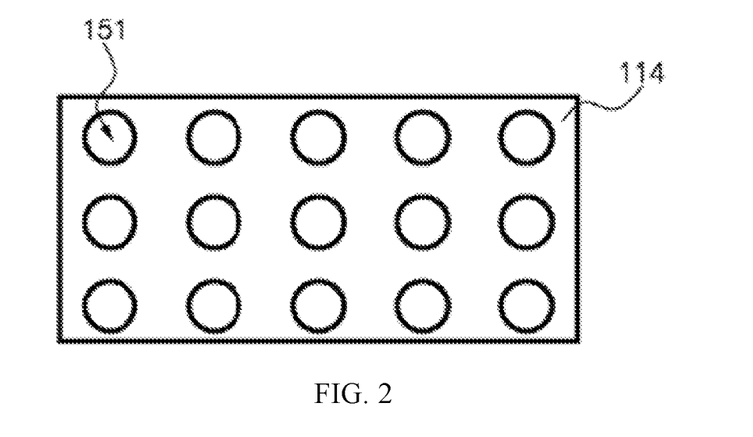
FIG. 2 is a schematic diagram of an arrangement of a plurality of through holes of the micro power generation device shown in FIG. 1.

In addition, as shown in FIG. 2, based on the design that the first through hole 151 penetrates the lower friction material layer 114 and the lower electrode 112, in the present embodiment, the first generator 110 may be provided with a plurality of first through holes 151. In other embodiments, the first generator 110 may only be provided with one first through hole 151 penetrating the lower friction material layer 114 and the lower electrode 112, which is not limited to this embodiment.

In addition, as shown in FIG. 2, based on the design that the first generator 110 is provided with a plurality of first through holes 151, in this embodiment, the plurality of first through holes 151 may be evenly arranged in an array. It should be noted that the arrangement of the plurality of first through holes 151 proposed in this specification and shown in FIG. 2 is directed to orthographic projections of the plurality of first through holes 151 on the surface of the lower friction material layer 114 facing the upper friction material layer 113. In other embodiments, when the first generator 110 is provided with a plurality of first through holes 151, the arrangement of the plurality of first through holes 151 can also adopt other regular arrangements, or irregular arrangements can be selected, which is not limited to this embodiment.

In other embodiments, based on the design that the first generator 110 is provided with a plurality of first through holes 151, the orthographic projections of the plurality of first through holes 151 on the surface of the lower friction material layer 114 facing the upper friction material layer 113 can also adopt the design that the orthographic projections are spaced around a center of the surface. Furthermore, if only one first through hole 151 is provided, the orthographic projection of the first through hole 151 on the surface of the lower friction material layer 114 facing the upper friction material layer 113 can be provided to be close to the edge of the surface. That is, the first through hole 151 is not provided in the central position of the lower electrode 112, so as to avoid the phenomenon that the first through hole 151 in the central position of the lower electrode 112 is blocked when the upper electrode 111 is pressed down to contact the lower electrode 112.

In addition, in this embodiment, the first through hole 151 may be a round hole, a square hole, or a polygonal hole.

In addition, in this embodiment, the material of the upper electrode 111 may be Indium Tin Oxides (ITO). In other embodiments, the material of the upper electrode 111 can also be selected from other metals or alloy materials, and is not limited to this embodiment. In addition, the material of the upper electrode 111 is not limited to the same material as the lower electrode 112, the upper electrode 121, or the lower electrode 122.

In addition, in this embodiment, the material of the lower electrode 112 may be indium tin oxide. In other embodiments, the material of the lower electrode 112 can also be selected from other metals or alloy materials, and is not limited to this embodiment. In addition, the material of the lower electrode 112 is not limited to the same material as the upper electrode 111, the upper electrode 121, or the lower electrode 122.

In addition, in this embodiment, the material of the upper electrode 121 may be indium tin oxide. In other embodiments, the material of the upper electrode 121 can also be selected from other metals or alloy materials, and is not limited to this embodiment. In addition, the material of the upper electrode 121 is not limited to the same material as the upper electrode 111, the lower electrode 112, or the lower electrode 122.

In addition, in this embodiment, the material of the lower electrode 122 may be indium tin oxide. In other embodiments, the material of the lower electrode 122 can also be selected from other metals or alloy materials, and is not limited to this embodiment. In addition, the material of the lower electrode 122 is not limited to the same material as the upper electrode 111, the lower electrode 112, or the upper electrode 121.

In addition, in this embodiment, the material of the upper friction material layer 113 may be polydimethylsiloxane (PDMS, also known as dimethyl silicone oil), nylon (polyamide fiber, also known as chinlon) or other silicone materials or synthetic fiber materials. In other embodiments, the material of the upper friction material layer 113 can also be selected from other materials on which the triboelectric effect is readily apparent, and is not limited to this embodiment.

In addition, in this embodiment, the material of the lower friction material layer 114 is different from the material of the upper friction material layer 113, and may be polydimethylsiloxane, nylon, other silicone materials, or synthetic fiber materials. In other embodiments, the material of the lower friction material layer 114 can also be selected from other materials on which the triboelectric effect is readily apparent, which is not limited to this embodiment.

In addition, in this embodiment, the material of the upper friction material layer 123 may be polydimethylsiloxane, nylon, other silicone materials, or synthetic fiber materials. In other embodiments, the material of the upper friction material layer 123 can also be selected from other materials on which the triboelectric effect is readily apparent, which is not limited to this embodiment.

In addition, in this embodiment, the material of the lower friction material layer 124 is different from the material of the upper friction material layer 123, and may be polydimethylsiloxane, nylon, other silicone materials, or synthetic fiber materials. In other embodiments, the material of the lower friction material layer 124 can also be selected from other materials on which the triboelectric effect is readily apparent, which is not limited to this embodiment.

For example, for any generator, if the material of either of the upper friction material layer or the lower friction material layer is selected to be polydimethylsiloxane, the material of the other one may be selected to be nylon. Of course, based on the design that the materials of the upper friction material layer and the lower friction material layer are different, the materials of the two can be flexibly selected. In addition, the materials of the friction material layers of each generator are not limited to be the same, which is not limited to this embodiment.

In addition, in this embodiment, the surface of the upper friction material layer 113 facing the lower friction material layer 114 may have a micro-nano structure. In other embodiments, other structures facilitating triboelectrification may also be provided on the surface of the upper friction material layer 113, which is not limited to this embodiment.

In addition, in the present embodiment, the surface of the lower friction material layer 114 facing the upper friction material layer 113 may have the micro-nano structure. In other embodiments, other structures facilitating triboelectrification may also be provided on the surface of the lower friction material layer 114, which is not limited to this embodiment.

In addition, in this embodiment, the surface of the upper friction material layer 123 facing the lower friction material layer 124 may have a micro-nano structure. In other embodiments, other structures facilitating triboelectrification can also be provided on the surface of the upper friction material layer 123, which is not limited to this embodiment.

In addition, in the present embodiment, the surface of the lower friction material layer 124 facing the upper friction material layer 123 may have a micro-nano structure. In other embodiments, other structures facilitating triboelectrification may be provided on the surface of the lower friction material layer 124, which is not limited to this embodiment.

In addition, in this embodiment, the gas 160 filled in the first internal cavity 141 and the intermediate cavity 143 may be an inert gas, such as helium (He), argon (Ar), or the like. Accordingly, the inertness of the inert gas can be utilized to ensure the stability of the first generator 110 during operation. In other embodiments, the gas 160 filled in the first internal cavity 141 and the intermediate cavity 143 may also use other inert gases or other non-inert gases such as air, etc., which is not limited to this embodiment.

With reference to the above detailed description of the structure of each part of the micro power generation device proposed by the present disclosure, and with reference to FIGS. 1, 3 to 7, the power generation principle and process of the micro power generation device will be exemplarily described below.

As shown in FIG. 1, the first generator 110 and the second generator 120 of the micro power generation device are both in an initial state, and there are no charges on the first generator 110 and the second generator 120.

As shown in FIG. 3, when the surface of the first generator 110 (i.e., the surface of the upper electrode 111 facing away from the lower electrode 112) is pressed, the upper electrode 111 deforms relative to the lower electrode 112, causing the upper friction material layer 113 to rub against the lower friction material layer 114. Because the materials of the upper friction material layer 113 and the lower friction material layer 114 are different, that is, the upper friction material layer 113 and the lower friction material layer 114 have different abilities to bind electrons, the upper friction material layer 113 and the lower friction material layer 114 carry positive and negative charges of the same quantity, respectively. At the same time, the gas 160 in the first internal cavity 141 reaches the intermediate cavity 143 through the through hole (for example, the first through hole 151), thereby compressing the upper electrode 121 of the second generator 120. Accordingly, the upper electrode 121 deforms relative to the lower electrode 122, causing the upper friction material layer 123 to rub against the lower friction material layer 124. Because the materials of the upper friction material layer 123 and the lower friction material layer 124 are different, that is, the upper friction material layer 123 and the lower friction material layer 124 have different abilities to bind electrons, the upper friction material layer 123 and the lower friction material layer 124 carry positive and negative charges of the same quantity, respectively.

Figure 4:
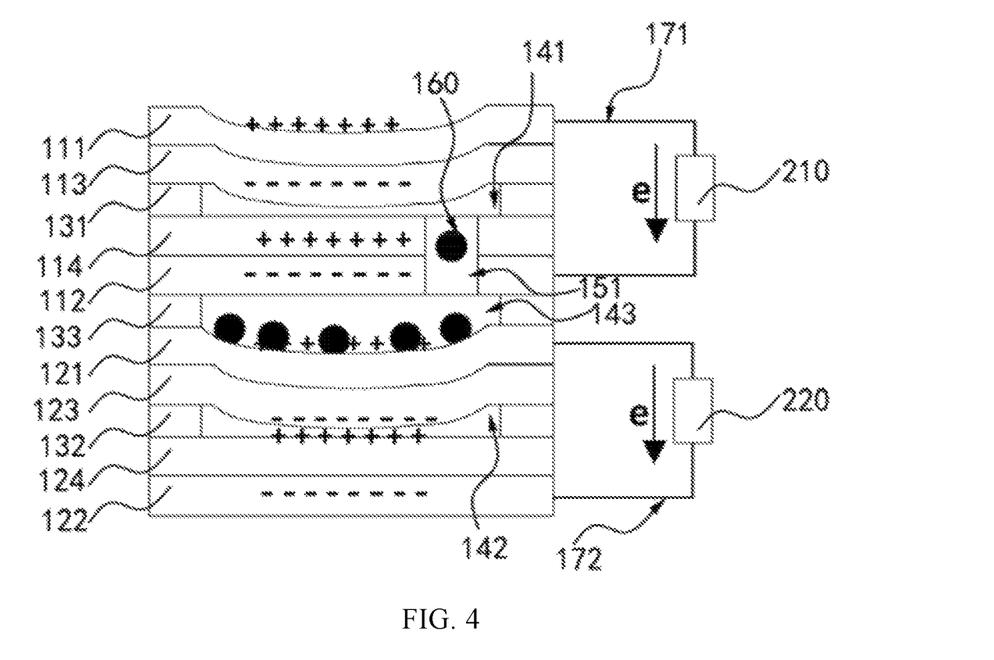
FIG. 4 is a schematic diagram of the micro power generation device shown in FIG. 1 in an operating state.

As shown in FIG. 4, when the applied pressure is removed, the upper electrode 111 and the upper friction material layer 113 of the first generator 110 gradually recover from the deformation. During the recovery process, in order to balance the potential, the first generator 110 generates a pulse current shown in the drawing in the first loop 171. At the same time, the gas 160 in the intermediate cavity 143 gradually reaches the first internal cavity 141 through the through hole, so that the upper electrode 121 and the upper friction material layer 123 of the second generator 120 gradually recover from the deformation. During the recovery process, in order to balance the potential, the second generator 120 generates a pulse current shown in the drawing in the second loop 172.

Figure 5:
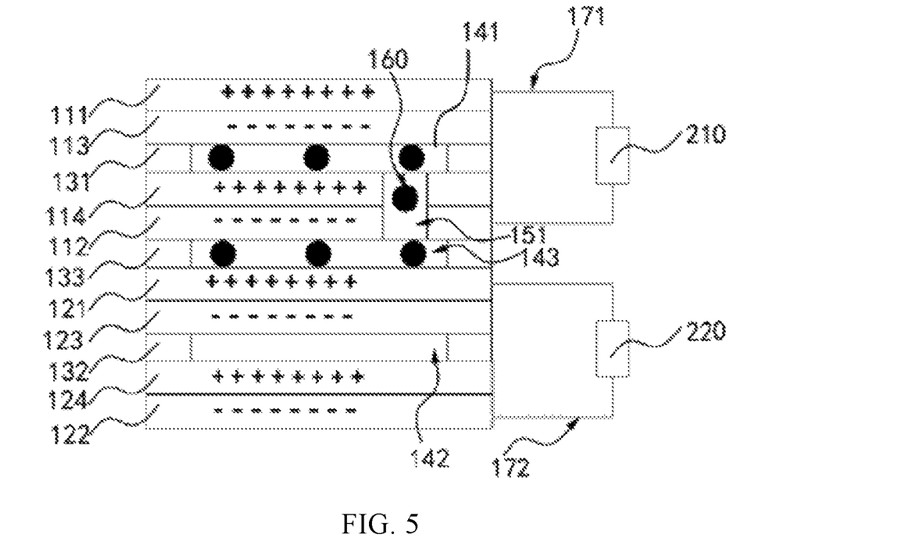
FIG. 5 is a schematic diagram of the micro power generation device shown in FIG. 1 in an operating state.

As shown in FIG. 5, when the upper electrode 111 and the upper friction material layer 113 of the first generator 110 as well as the upper electrode 121 and the upper friction material layer 123 of the second generator 120 recover to the initial state, the pulse currents in the first loop 171 and in the second loop 172 disappear.

Figure 6:
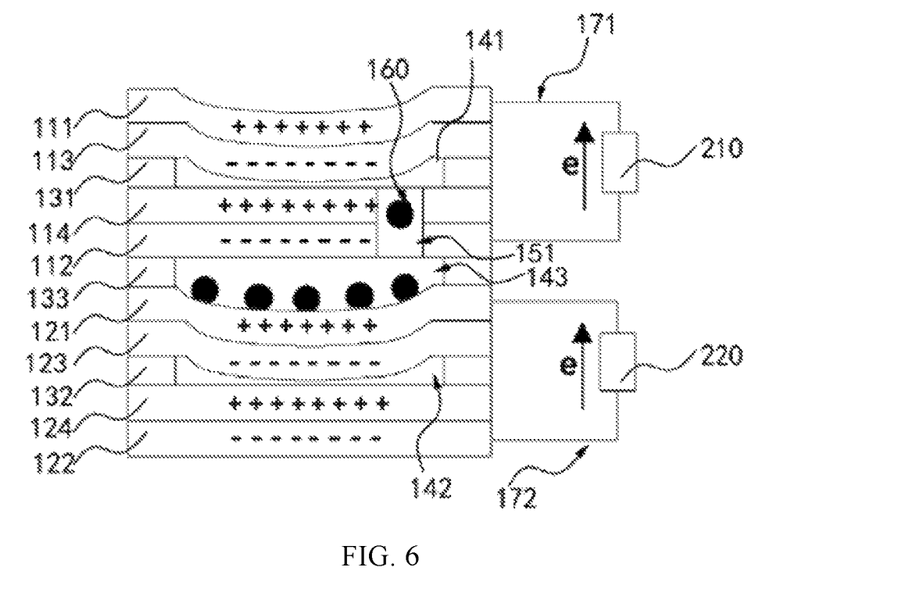
FIG. 6 is a schematic diagram of the micro power generation device shown in FIG. 1 in an operating state.

As shown in FIG. 6, when the surface of the first generator 110 is pressed again, a pulse current in a direction opposite to that of the pulse current in the above steps is formed in the first loop 171 and the second loop 172, respectively.

Figure 7:
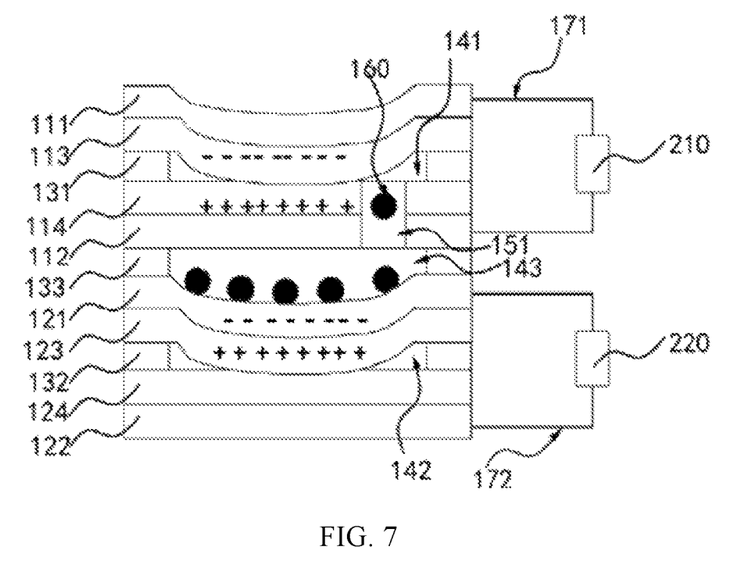
FIG. 7 is a schematic diagram of the micro power generation device shown in FIG. 1 in an operating state.

As shown in FIG. 7, when the upper friction material layer 113 and the lower friction material layer 114 are completely in contact again, and the upper friction material layer 123 and the upper friction material layer 123 are completely in contact again, the above-mentioned pulse currents disappear.

Figure 8:
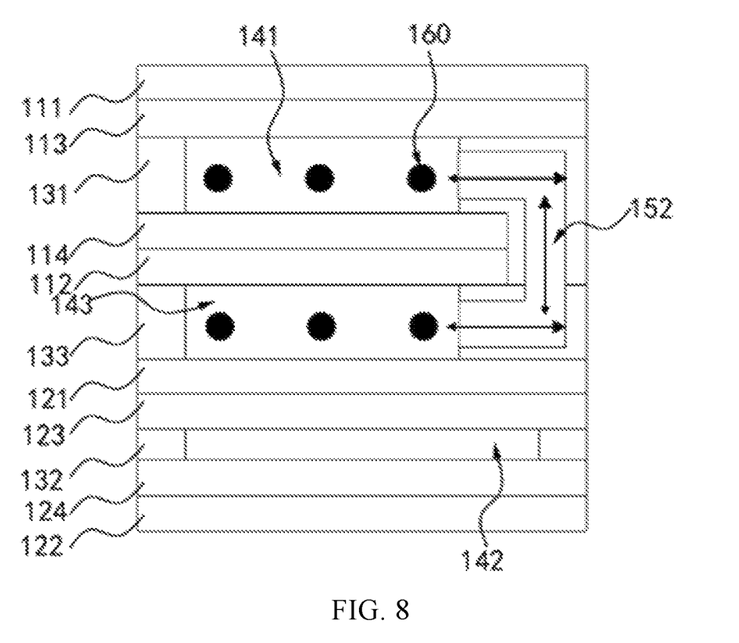
FIG. 8 is a schematic diagram of a micro power generation device according to another exemplary embodiment.

Referring to FIG. 8, based on the above detailed description of an exemplary embodiment of the micro power generation device proposed by the present disclosure, another exemplary embodiment of the micro power generation device will be described below. In this exemplary embodiment, the structures, connection manners, and functional relationships of the main components of the micro power generation device proposed in the present disclosure are basically the same as those in the first embodiment, and the main differences between the two will be described below.

In this embodiment, the through hole may adopt the structural design shown in FIG. 8. In addition, in order to distinguish it from the through holes of other structural forms, the through hole may be defined as the second through hole 152. Specifically, an orifice at one end of the second through hole 152 is opened on a side wall of the first internal cavity 141 defined by the first peripheral spacer 131, and an orifice at the other end of the second through hole 152 is opened on a side wall of the intermediate cavity 143 defined by the intermediate spacer 133.

As shown in FIG. 8, in this embodiment, when the through hole adopt the above-mentioned design of the second through hole 152, the second through hole 152 may be completely opened through the first peripheral spacer 131 and the intermediate spacer 133. The first peripheral spacer 131 may include a portion provided between the peripheral edges of the upper electrode 111 and the lower electrode 112, and further include another portion extending downward along the outer edge of the lower electrode 112 and contacting the intermediate spacer 133. At this time, at the position where the second through hole 152 needs to be opened, the first peripheral spacer 131 and the intermediate spacer 133 together form a structure with a substantially C-shaped cross section, and the second through hole 152 is opened in the C-shaped structure, the hole channel of the second through hole 152 may be substantially C-shaped. It should be noted that the "peripheral edge" mentioned above refers to an edge portion of the periphery of the upper electrode 111 or the lower electrode 112. For example, the intermediate spacer 133 may be provided between the peripheral edges of the lower electrode 112 and the upper electrode 121.

In other embodiments, for example, based on the structure of the first peripheral spacer 131, the lower electrode 112, and the intermediate spacer 133 shown in FIG. 1, and based on the design that the two orifices at ends of the second through hole 152 are respectively opened in the first peripheral spacer and the intermediate spacer 133, the second through hole 152 may also adopt a hole channel structure penetrating the first peripheral spacer 131, the lower electrode 112 (including the lower friction material layer 114) and the intermediate spacer 133.

In addition, based on the design that the two orifices at ends of the second through hole 152 are respectively opened in the first peripheral spacer and the intermediate spacer 133, in this embodiment, the first generator 110 may be provided with a plurality of second through holes 152. In other embodiments, the first generator 110 may also only be provided with one second through hole 152, which is not limited to this embodiment.

In addition, based on the design that the first generator 110 is provided with a plurality of second through holes 152, in this embodiment, the plurality of second through holes 152 may be evenly arranged around the peripheral edges of the first generator 110. It should be noted that the arrangement of the plurality of second through holes 152 proposed in this specification is directed to the orthographic projections of the plurality of second through holes 152 on the surface of the lower friction material layer 114 facing the upper friction material layer 113. In other embodiments, when the first generator 110 is provided with a plurality of second through holes 152, the arrangement of the plurality of second through holes 152 can also adopt other regular arrangements, or irregular arrangements can be selected, which is not limited to this embodiment.

In addition, in this embodiment, the second through hole 152 may be a round hole, a square hole, or a polygonal hole.

Figure 9:
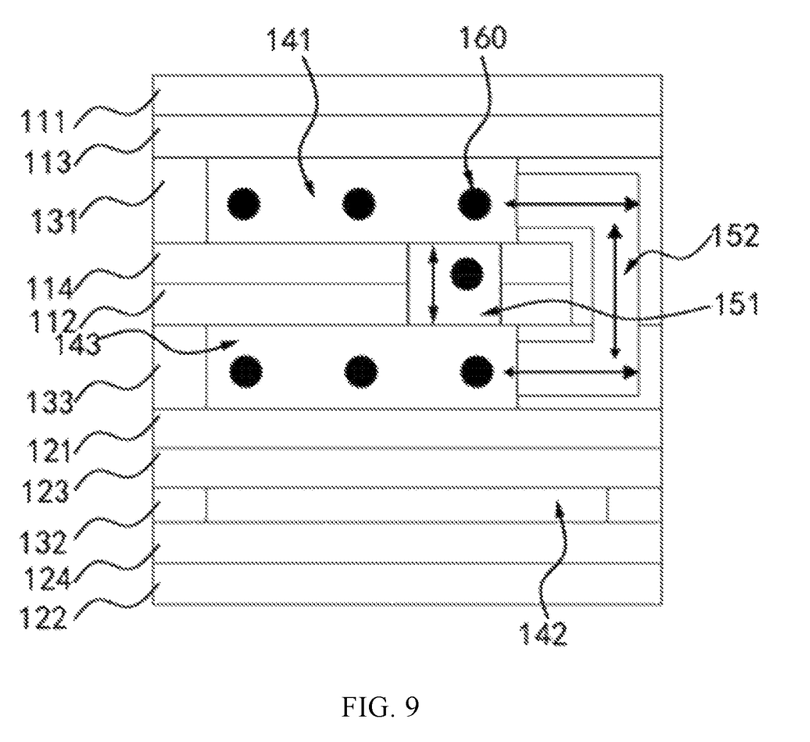
FIG. 9 is a schematic diagram of a micro power generation device according to yet another exemplary embodiment.

Referring to FIG. 9, based on the above detailed description of two exemplary embodiments of the micro power generation device proposed by the present disclosure, still another exemplary embodiment of the micro power generation device will be described below. In this exemplary embodiment, the structures, connection manners, and functional relationships of the main components of the micro power generation device proposed in the present disclosure are basically the same as those in the first embodiment and in the second embodiment, and the main differences between the embodiments will be described below.

In this embodiment, the through hole may adopt the structural design shown in FIG. 9. That is, the through holes include both the first through hole 151 in the first embodiment and the second through hole 152 in the second embodiment. The number of the first through holes 151 may be at least one, the number of the second through holes 152 may also be at least one, and the number of the first through holes 151 may be the same as or different from that of the second through holes 152. Specifically, the first through hole 151 may penetrate the lower friction material layer 114 and the lower electrode 112. An orifice at one end of the first through hole 151 is opened on the surface of the lower friction material layer 114 facing the upper friction material layer 113, and an orifice at the other end of the first through hole 151 is opened on the surface of the lower electrode 112 facing the upper electrode 121. Meanwhile, the second through hole 152 may penetrate the first peripheral spacer 131, the lower friction material layer 114, the lower electrode 112, and the intermediate spacer 133. An orifice at one end of the second through hole is opened on the side wall of the first internal cavity 141 defined by the first peripheral spacer 131, and an orifice at the other end of the second through hole is opened on the side wall of the intermediate cavity 143 defined by the intermediate spacer 133.

In addition, based on the design that the first through hole 151 penetrates the lower friction material layer 114 and the lower electrode 112, in this embodiment, the first generator 110 may be provided with a plurality of first through holes 151. In other embodiments, the first generator 110 may only be provided with one first through hole 151 penetrating the lower friction material layer 114 and the lower electrode 112, which is not limited to this embodiment.

In addition, based on the design that the first generator 110 is provided with a plurality of first through holes 151, in this embodiment, the plurality of first through holes 151 may be evenly arranged in an array. It should be noted that the arrangement of the plurality of first through holes 151 proposed in this specification is directed to the orthographic projections of the plurality of first through holes 151 on the surface of the lower friction material layer 114 facing the upper friction material layer 113. In other embodiments, when the first generator 110 is provided with a plurality of first through-holes 151, the arrangement of the plurality of first through-holes 151 can also adopt other regular arrangements, or irregular arrangements can be selected, which is not limited to this embodiment.

In addition, based on the design that the second through hole 152 penetrates the first peripheral spacer 131, the lower friction material layer 114, the lower electrode 112, and the intermediate spacer 133, in this embodiment, the first generator 110 may be provided with a plurality of second through holes 152. In other embodiments, the first generator 110 may only be provided with one second through hole 152 penetrating the first peripheral spacer 131, the lower friction material layer 114, the lower electrode 112, and the intermediate spacer 133, which is not limited to this embodiment.

In addition, based on the design that the first generator 110 is provided with a plurality of second through holes 152, in this embodiment, the plurality of second through holes 152 may be evenly arranged around the peripheral edges of the first generator 110. It should be noted that the arrangement of the plurality of second through holes 152 proposed in this specification is directed to the orthographic projections of the plurality of second through holes 152 on the surface of the lower friction material layer 114 facing the upper friction material layer 113. In other embodiments, when the first generator 110 is provided with a plurality of second through holes 152, the arrangement of the plurality of second through holes 152 can also adopt other regular arrangements, or irregular arrangements can be selected, which is not limited to this embodiment.

Figure 10:
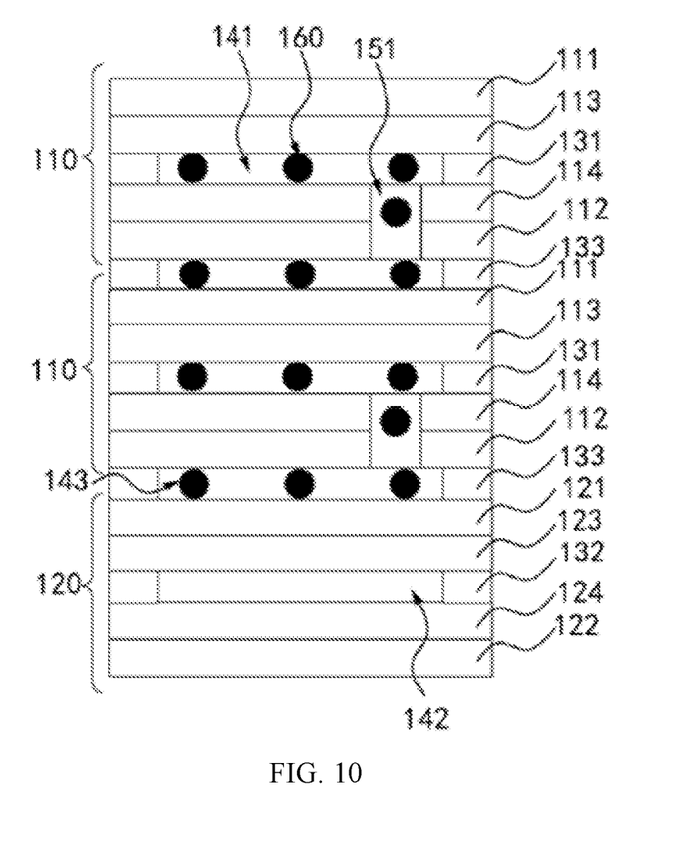
FIG. 10 is a schematic diagram of a micro power generation device according to still another exemplary embodiment.

With reference to FIG. 10, based on the above detailed description of the three exemplary embodiments of the micro power generation device proposed by the present disclosure, yet another exemplary embodiment of the micro power generation device will be described below. In this exemplary embodiment, the structures, connection manners, and functional relationships of the main components of the micro power generation device proposed in the present disclosure are basically the same as those in the first embodiment and in the second embodiment, and the main differences between the embodiments will be described below.

As shown in FIG. 10, in the present embodiment, the micro power generation device proposed by the present disclosure includes a plurality of first generators 110. As an example, two first generators 110 are shown in the drawing. One of the first generators 110 is provided above the other first generator 110 through the intermediate spacer 133 (on a side of the other first generator away from the second generator 120). That is, the lower electrode 112 of the first one of the first generators 110 is provided, through the intermediate spacers 133, on the side of the upper electrode 111 of the other first generator 110 away from the second generator 120. The other first generator 110 is provided above the second generator through another intermediate spacer 133, that is, the lower electrode 112 of the other first generator 110 is provided on the side of the upper electrode 121 of the second generator 120 away from the lower electrode 122 through another intermediate spacer 133. In other embodiments, the number of the first generators 110 may be more than two, and the multiple first generators 110 are sequentially arranged on the second generator 120 in the above manner.

With the above design of this embodiment, when the upper electrode 111 of the uppermost first generator 110 (i.e., the first generator 110 farthest from the second generator 120) is pressed, the upper electrode 111 deforms relative to the lower electrode 112, causing the upper friction material layer 113 to rub against the lower friction material layer 114. In this way, the power generation function of the uppermost first generator 110 is achieved. At the same time, the gas 160 in the first internal cavity 141 of the uppermost first generator 110 reaches the intermediate cavity 143 through the through hole (for example, the first through hole 151), so that the upper electrode 111 of another adjacent first generator 110 below the uppermost first generator is compressed, and then the upper electrode 111 of the adjacent first generator 110 deforms relative to the lower electrode 112, and causes the upper friction material layer 113 to rub against the lower friction material layer 114 thereof, thereby realizing the power generation function of the adjacent first generator 110, and so on. As for one of the first generators 110 adjacent to the second generator 120, a portion of the gas 160 in the first internal cavity 141 of the first generator is compressed into the intermediate cavity 143 formed between the first generator and the second generator 120, so that the upper electrode 121 of the second generator 120 is compressed and deforms relative to the lower electrode 122, thereby realizing the function of power generation of the second generator 120.

In addition, based on the above-described exemplary description of the present disclosure, the micro power generation device proposed by the present disclosure can be applied to various fields. That is, according to the needs of different fields and the installation environment, the specific size of the structure of each part of the micro power generation device can have a variety of choices, such as centimeter, micrometer, or nanometer.

It should be noted here that the micro power generation devices shown in the drawings and described in this specification are just a few examples of many types of micro power generation devices that can adopt the principles of the present disclosure. It should be clearly understood that the principles of the present disclosure are by no means limited to any details or any components of the micro power generation device shown in the drawings or described in this specification.

Based on the above detailed description of several exemplary embodiments of the micro-generator proposed by the present disclosure, an exemplary embodiment of an electronic apparatus proposed by the present disclosure will be described below.

In this embodiment, the electronic device proposed in the present disclosure mainly includes a power generation device and a power consumption device. Specifically, the power generation device is the micro power generation device proposed in the present disclosure and described in detail in the above embodiment. There are a plurality of power consumption devices, and the plurality of power consumption devices are electrically connected to the plurality of generators of the micro power generation device, respectively. The power generation device is used to supply power to the plurality of power consumption devices individually through the plurality of generators. Referring to FIG. 3, the first power consumption device 210 and the second power consumption device 220 can be understood as two power consumption devices of the electronic apparatus.

In addition, in this embodiment, the electronic device proposed by the present disclosure further includes multiple power supply loops. Specifically, a plurality of power supply loops are electrically connected between the plurality of generators and the plurality of power consumption devices, respectively. Referring to FIG. 3, the first loop 171 and the second loop 172 can be understood as two power supply loops of the electronic apparatus.

It should be noted here that the electronic apparatus shown in the drawings and described in this specification are just a few examples of many types of the electronic apparatus that can adopt the principles of the present disclosure. It should be understood that the principles of the present disclosure are by no means limited to any details or any components of the electronic device shown in the drawings or described in this specification.

In summary, the micro power generation device proposed by the present disclosure includes a plurality of generators stacked one above the other. The internal cavity of the upper one of any two adjacent generators communicates with the intermediate cavity between the two generators. Each internal cavity and the intermediate cavity are filled with gas. According to this, while the upper one of the two adjacent generators is subjected to pressure and friction to generate charges, the other lower generator is subjected to pressure and friction to generate charges since the gas in the internal cavity of the upper one of the two adjacent generators is compressed into the intermediate cavity below it, and so on. The operating of the multiple generators stacked one above the other is realized. According to this, the micro power generation device proposed by the present disclosure can use multiple generators to supply power simultaneously, thereby realizing power supply from the power generation device to multiple power consumption devices.

Exemplary embodiments of the micro power generation device and the electronic device with the same proposed in the present disclosure are described and/or illustrated in detail above. However, the embodiments of the present disclosure are not limited to the specific embodiments described herein. On the contrary, the components and/or steps of each embodiment may be used independently and separately from other components and/or steps described herein. Each component and/or each step of one embodiment may also be used in combination with other components and/or steps of other embodiments. When the elements/components/equivalents described and/or illustrated here are introduced, the terms "a", "one", "said", etc. are used to indicate that there are one or more elements/components or the like. The terms "include", "contain", and "have" are used to indicate an open type meaning of including and means that there may be additional elements/components/etc. in addition to the listed elements/components/etc. In addition, the terms "first" and "second" etc. in the claims and the description are used only as markers, and do not limit the number of objects.

Although the micro power generation device and the electronic apparatus provided with the same have been described according to different specific embodiments, those skilled in the art will recognize that the implementation of the present disclosure can be modified within the spirit and scope of the claims.

What is claimed is:

1. A micro power generation device, comprising a plurality of generators stacked one above the other, wherein each of the plurality of generators comprises:
   an upper electrode and a lower electrode spaced up and down;
   a peripheral spacer provided between peripheral edges of the upper electrode and the lower electrode;
   an upper friction material layer provided on a side of the upper electrode facing the lower electrode; and
   a lower friction material layer provided on a side of the lower electrode facing the upper electrode,
   wherein the upper friction material layer, the lower friction material layer, and the peripheral spacer together form an internal cavity, and an intermediate spacer is provided between any two adjacent generators among the plurality of generators, wherein any two adjacent generators and the intermediate spacer together form an intermediate cavity, and the intermediate cavity is filled with gas; and the internal cavity of an upper generator of any two adjacent generators is interconnected with the intermediate cavity between the two adjacent generators.

2. The micro power generation device according to claim 1, wherein the upper generator of any two adjacent generators is provided with a through hole, and the through hole is configured to communicate the internal cavity of the upper generator with the intermediate cavity between the two adjacent generators.

3. The micro power generation device according to claim 2, wherein an orifice at one end of the through hole is opened on a surface of the lower friction material layer facing the upper friction material layer, and an orifice at the other end of the through hole is opened on a surface of the lower electrode facing the upper electrode of an adjacent generator below the generator.

4. The micro power generation device according to claim 3, wherein the upper generator of any two adjacent generators is provided with a plurality of through holes.

5. The micro power generation device according to claim 4, wherein the plurality of through holes are arranged in at least one of the following manners:
   the plurality of through holes are arranged in an array; and
   the plurality of through holes are evenly arranged.

6. The micro power generating device according to claim 2, wherein an orifice at one end of the through hole is opened on a side wall of the internal cavity, and an orifice at the other end of the through hole is opened on a side wall of the intermediate cavity.

7. The micro power generation device according to claim 2, wherein:
   the through hole of at least one of the plurality of generators comprises at least one first through hole and at least one second through hole;
   an orifice at one end of the first through hole is opened on a surface of the lower friction material layer facing the upper friction material layer, and an orifice at the other end of the first through hole is opened on a surface of the lower electrode facing the upper electrode of an adjacent generator below the generator; and
   an orifice at one end of the second through hole is opened on a side wall of the internal cavity, and an orifice at the other end of the second through hole is opened on a side wall of the intermediate cavity.

8. The micro power generation device according to claim 2, wherein the through hole is a round hole, a square hole, or a polygonal hole.

9. The micro power generation device according to claim 1, wherein at least one of the upper electrode and the lower electrode is made from indium tin oxide.

10. The micro power generation device according to claim 1, wherein a material of the upper friction material layer is polydimethylsiloxane, and a material of the lower friction material layer is nylon.

11. The micro power generation device according to claim 1, wherein a surface of the upper friction material layer of each of the generators facing the lower friction material layer has a micro-nano structure.

12. The micro power generation device according to claim 1, wherein the gas is an inert gas.

13. The micro power generation device according to claim 1, wherein the micro power generation device comprises two of the plurality of generators stacked one above the other.

14. An electronic apparatus, comprising:
a power generation device and multiple power consumption devices, wherein the power generation device is a micro power generation device comprising a plurality of generators stacked one above the other, wherein each of the plurality of generators comprises:
   an upper electrode and a lower electrode spaced up and down;
   a peripheral spacer provided between peripheral edges of the upper electrode and the lower electrode;
   an upper friction material layer provided on a side of the upper electrode facing the lower electrode; and
   a lower friction material layer provided on a side of the lower electrode facing the upper electrode, wherein the upper friction material layer, the lower friction material layer and the peripheral spacer together form an internal cavity, and an intermediate spacer is provided between any two adjacent generators among the plurality of generators, wherein any two adjacent generators and the intermediate spacer together form an intermediate cavity, and the intermediate cavity is filled with gas; the internal cavity of an upper generator of any two adjacent generators is interconnected with the intermediate cavity between the two adjacent generators; and
multiple power consumption devices, wherein the multiple power consumption devices are electrically connected to multiple ones of the plurality of generators of the micro power generation device, respectively, and the multiple ones of the plurality of generators are configured to supply power to the multiple power consumption devices, respectively.

15. The electronic apparatus according to claim 14, further comprising a plurality of power supply loops, and the plurality of power supply loops are electrically connected between the multiple generators and the multiple power consumption devices, respectively.

16. The micro power generation device according to claim 1, wherein a material of the upper friction material layer is nylon, and a material of the lower friction material layer is poly dim ethyl siloxane.

17. The micro power generation device according to claim 1, wherein a surface of the lower friction material layer of each of the generators facing the upper friction material layer has a micro-nano structure.

18. The micro power generation device according to claim 11, wherein a surface of the lower friction material layer of each of the generators facing the upper friction material layer has a micro-nano structure.

19. The electronic apparatus according to claim 14, wherein the upper generator of any two adjacent generators is provided with a through hole, and the through hole is configured to communicate the internal cavity of the upper generator with the intermediate cavity between the two adjacent generators.

20. The electronic apparatus according to claim 19, wherein an orifice at one end of the through hole is opened on a side wall of the internal cavity, and an orifice at the other end of the through hole is opened on a side wall of the intermediate cavity.

* * * * *